(12) United States Patent
Rath et al.

(10) Patent No.: US 8,400,618 B2
(45) Date of Patent: Mar. 19, 2013

(54) METHOD FOR ARRANGING AN OPTICAL MODULE IN A MEASURING APPARATUS AND A MEASURING APPARATUS

(75) Inventors: Martin Rath, Adelmannsfelden (DE); Ulrich Mueller, Aalen (DE); Waldemar Mielke, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 463 days.

(21) Appl. No.: 12/706,560

(22) Filed: Feb. 16, 2010

(65) Prior Publication Data

US 2010/0208230 A1    Aug. 19, 2010

(30) Foreign Application Priority Data

Feb. 16, 2009   (DE) .......................... 10 2009 009 062

(51) Int. Cl.
*G03B 27/32*           (2006.01)

(52) U.S. Cl. ............................... 355/77; 355/67; 355/68

(58) Field of Classification Search .................... 355/50, 355/53, 67, 68, 77
See application file for complete search history.

(56) References Cited

U.S. PATENT DOCUMENTS

| 5,479,238 | A  | * | 12/1995 | Whitney ......................... 355/53 |
| 2005/0274897 | A1 | * | 12/2005 | Singer et al. .................. 250/372 |
| 2006/0209283 | A1 | * | 9/2006 | Nawata ........................... 355/53 |
| 2008/0309907 | A1 |   | 12/2008 | Stuetzle |

FOREIGN PATENT DOCUMENTS

| DE | 10360581 A1 | 7/2005 |
| DE | 102005019726 A1 | 10/2006 |
| DE | 102008011761 A1 | 9/2008 |

* cited by examiner

*Primary Examiner* — Thomas R Artman
(74) *Attorney, Agent, or Firm* — Sughrue Mion, PLLC

(57) ABSTRACT

A method for arranging an optical module in a measuring apparatus includes: providing the measuring apparatus with an irradiation system for irradiating the optical module with electromagnetic radiation, a reference component, and a detection element defining a detection surface, the detection element being disposed in a defined position in relation to the reference component, disposing the optical module in the measuring apparatus such that the radiation emitted by the irradiation system passes through the optical module and impinges onto the detection surface as an exit beam, measuring a position of the exit beam in relation to the detection surface, adjusting the position of the optical module within the measuring apparatus such that the position of the exit beam in relation to the detection surface is brought to correspond to a predetermined position, and establishing position parameters defining the position of the optical module in relation to the reference component.

24 Claims, 4 Drawing Sheets

METHOD FOR ARRANGING AN OPTICAL MODULE IN A MEASURING APPARATUS AND A MEASURING APPARATUS

The following disclosure is based on German Patent Application No. DE 10 2009 009 062.2, filed on Feb. 16, 2009, which is incorporated into this application by reference.

FIELD OF AND BACKGROUND TO THE INVENTION

The present invention relates to a method for arranging an optical module, in particular for a microlithography projection exposure system, in a measuring apparatus. Moreover, the invention relates to a measuring apparatus of this type and to a method for mounting an optical module in a projection exposure system for microlithography.

When producing a projection exposure system for microlithography individual optical modules of the projection exposure system are produced separately by the manufacturer, and are only fitted into the projection exposure system at the customer's premises. These types of separately produced optical modules can be e.g. illumination optics or a projection objective of the exposure system. Each of these optical modules comprises a series of optical elements which are adjusted in relation to one another by the manufacturer so that the optical characteristics of the module correspond to a target specification with a specific tolerance. The adjustment of the optical elements within the optical module takes place in an optical measuring apparatus. The optical module is then fitted in the projection exposure system at the client's premises. Here the optical module is generally disposed at a pre-specified position within the projection exposure system.

As already mentioned above, the actual optical characteristics of the module deviate from the target specification. In particular, the optical module to be fitted has an optical path the actual course of which within the optical module deviates from a desired course, so that during exposure operation of the projection exposure system an exit beam passing out of the optical module has a location and an orientation which deviate from a desired location and a desired orientation. It is therefore necessary to match the optical characteristics of the fitted optical module to the optical path of the projection exposure system. This is usually implemented by measuring optical parameters of the projection exposure system with the fitted optical module at the client's premises, and optimizing the latter by correspondingly adjusting optical elements of the projection exposure system. This adjustment process is very complex, however, and only enables optimization of the optical properties of the projection exposure system to a certain degree. The requirements for the optical quality of projection exposure systems are continuously becoming more and more stringent, however.

OBJECTS AND SUMMARY OF THE INVENTION

It is an object of the invention to solve the aforementioned problems, and in particular to provide a method with which the complexity of adjusting a projection exposure system for microlithography at the customer's premises can be reduced.

According to the invention a method for arranging an optical module, in particular for a microlithography projection exposure system, is provided in a measuring apparatus. The method comprises providing the measuring apparatus with an irradiation system for irradiating the optical module with electromagnetic radiation, a reference component and a detection element defining a detection surface, the detection element being disposed in a defined position in relation to the reference component. Furthermore, the method according to the invention comprises: disposing the optical module in the measuring apparatus such that the radiation emitted by the irradiation system passes through the optical module and impinges onto the detection surface as an exit beam, measuring a position of the exit beam in relation to the detection surface, adjusting the position of the optical module within the measuring apparatus such that the position of the exit beam in relation to the detection surface is brought to correspond to a predetermined position, and establishing position parameters defining the position of the optical module in relation to the reference component.

Furthermore, according to the invention a measuring apparatus for an optical module, in particular for a microlithography projection exposure system, is provided. The measuring apparatus according to the invention comprises: an irradiation system configured to irradiate the optical module with electromagnetic radiation, a holding device configured to hold the optical module such that the radiation emitted by the irradiation system passes through the optical module and impinges onto a detection surface as an exit beam, a reference component, and a detection module with a detection element defining the detection surface. The detection element is disposed in a defined position in relation to the reference component, and the detection module is configured to measure a position of the exit beam in relation to the detection surface. Furthermore, the measuring apparatus comprises an adjustment device which is configured to adjust the position of the optical module in the measuring apparatus such that the position of the exit beam in relation to the detection surface is brought to correspond to a predetermined position, and a position sensor system which is configured to establish the position parameters which define the position of the optical module in relation to the reference component.

Furthermore, according to the invention a method for mounting an optical module in a projection exposure system for microlithography is provided. The optical module has actual optical characteristics which differ from predetermined optical characteristics. The method according to the invention comprises: providing position parameters for defining a position for the optical module in relation to a reference component of the projection exposure system, the position parameters being selected such that upon disposing the optical module in the defined position the actual optical characteristics of the optical module are matched to the optical path of the projection exposure system following the optical module, and inserting the optical module into the projection exposure system and disposing the optical module in the defined position by adjusting the optical module relative to the reference component.

With the method according to the invention for arranging an optical module in a measuring apparatus or the measuring apparatus according to the invention, position parameters are established taking into account the actual optical characteristics of the optical module. These position parameters define a position of the optical module in relation to a reference component of the measuring apparatus in which the exit beam has a predetermined position in relation to a detection element.

The detection element is disposed in a defined position in relation to the reference component. In this context, a defined position is to be understood as meaning that the position, and so the coordinate position and/or the orientation, of the detection element in relation to the reference component during implementation of the method is defined, and so is known.

This can either be achieved by the detection element being connected rigidly to the reference component, or by the detection element being mounted on the reference component so that it is basically moveable, but is locked in a pre-determined position during the process. Furthermore, the position of the detection component can also be flexible and be continuously measured during the measuring process, for example using an interferometer. In this case the respective position can be taken into consideration calculatively when establishing the position parameters.

Since the detection element is disposed in a defined position in relation to the reference component, the position which is adopted by the exit beam in relation to the detection element is correlated to the position of the reference component. The position of the exit beam in relation to the detector surface measured according to the invention with the measuring apparatus can comprise a location of the exit beam on the detector surface and/or an orientation of the exit beam relative to the detection surface.

As already mentioned above, the position parameters established by the measuring apparatus according to the invention define a position of the optical module in relation to a reference component of the measuring apparatus in which the exit beam adopts a predetermined position in relation to a detection element. These position parameters can be used when mounting the optical module in a projection exposure system at the customer's premises.

For this purpose a reference component can be provided in the projection exposure system. This reference component can be disposed within the projection exposure system such that it has the same position in relation to the optical module as the reference component of the measuring apparatus. Alternatively, the reference component of the projection exposure system can also have a relative position different to the reference component of the measuring apparatus. In this case the position parameters established by the measuring apparatus are to be adapted correspondingly if so required.

Therefore, the position parameters, if required adapted to the conditions in the projection exposure system, define a position for the optical module within the projection exposure system. This defined position specifies a position of the optical module in relation to the reference component of the projection exposure system in which the actual optical characteristics of the optical module are matched to the optical path of the projection exposure system following the optical module. Here the actual optical characteristics of the optical module are matched to the optical path of the projection exposure system following the optical module such that during the exposure operation of the projection exposure system an exit beam of exposure radiation leaving the optical module enters in a predetermined position into the optical path of the projection exposure system following the optical module.

Since the position parameters establish the location and/or the orientation of the exit beam in relation to the reference component of the projection exposure system, the actual optical characteristics of the optical module when disposing the latter in the position defined by the position parameters are matched to the optical path of the projection exposure system following the optical module. However, for this purpose the optical path must be disposed in a defined location and orientation in relation to the reference component.

Therefore, the invention makes it possible during mounting in the projection exposure system to position the optical module in the projection exposure system by adjusting its position using the position parameters established with the measuring apparatus such that the actual optical characteristics of the optical module are already matched to the optical path of the projection exposure system. Further adjustment of optical elements of the projection exposure system for fine matching to the actual optical characteristics of the optical module is therefore facilitated or even made superfluous. With this type of fine matching, required with the conventional method, the optical module is positioned in the projection exposure system by assuming defined optical characteristics of the optical module in the projection exposure system. The optical characteristics of the projection exposure system are then measured, and errors established here, which, if applicable, are attributable to deviations of the actual optical characteristics of the optical module from its defined characteristics, are compensated by corresponding adjustment of optical elements.

Due to the discontinuation or the facilitation of fine matching due to the solution according to the invention, the complexity of the adjustment of a projection exposure system at the customer's premises can be greatly reduced. The optical properties of the projection exposure system in the mounted final state can also be improved.

In a further embodiment according to the invention the measurement of the position of the exit beam in relation to the detection surface comprises determining the location of the exit beam on the detection surface, and the adjustment of the position of the optical module within the measuring apparatus is implemented such that at least the location of the exit beam on the detection surface is brought to correspond to a predetermined location. Before adjusting the position of the optical module, if so required individual optical elements of the optical module can also be adjusted such that the location of the exit beam on the detection surface is brought close to the predetermined location. It is thus ensured that the extent of the correction of the position of the optical module remains within an acceptable range.

In a further embodiment according to the invention the measurement of the position of the exit beam in relation to the detection surface comprises determining the orientation of the exit beam relative to the detection surface, and the adjustment of the position of the optical module in the measuring apparatus is implemented such that at least the orientation of the exit beam relative to the detection surface is brought to correspond to a predetermined orientation. The measurement of the position of the exit beam in relation to the detection surface can, furthermore, comprise both determining the location of the exit beam on the detection surface and determining the orientation of the exit beam relative to the detection surface, and the adjustment of the position of the optical module within the measuring apparatus can then be implemented such that the location of the exit beam on the detection surface is brought to correspond to a predetermined location and the orientation of the exit beam relative to the detection surface is brought to correspond to a predetermined orientation. Before adjusting the position of the optical module, if required, individual optical elements of the optical module can also be adjusted such that the orientation of the exit beam relative to the detection surface is brought close to the predetermined orientation. It is therefore also ensured here that the extent of the correction of the position of the optical module remains within an acceptable range.

In a further embodiment according to the invention the measuring apparatus comprises a second detection element which defines a second detection surface, the second detection element being disposed in a defined coordinate position in relation to the reference component, the measurement of the position of the exit beam in relation to the first detection surface comprising determining the location of the exit beam on the first detection surface and determining the orientation of the exit beam relative to the second detection surface, and the adjustment of the position of the optical module within the measuring apparatus being implemented such that the location of the exit beam on the first detection surface is brought to correspond to a predetermined location, and the orientation of the exit beam relative to the second detection surface is brought to correspond to a predetermined orientation. The positioning of the exit beam is implemented here in up to six degrees of freedom, i.e. in up to three degrees of translational freedom and up to three degrees of rotational freedom. The first detection surface and the second detection surface can be disposed at the same location during the respective measurement.

In a further embodiment according to the invention the position parameters of the optical module are measured by determining the location and/or the orientation of the optical module in relation to the reference component. This is implemented in particular in three dimensions respectively.

In a further embodiment according to the invention the optical module has at least one reference element, and the position of the optical module is established by determining the location of the reference element in relation to the reference component in at least one dimension. In particular, the optical module has three reference elements which are disposed e.g. on the housing of the optical module. In this case both the location and the orientation of the optical module in relation to the reference component are established by measuring the reference elements in three dimensions respectively.

In a further embodiment according to the invention the reference element has two reference surfaces tilted towards one another on each of which a distance measurement is taken with at least one distance sensor disposed in a defined coordinate position in relation to the reference component. This type of distance sensor can be in the form e.g. of a chromatic distance sensor, as described in greater detail in the following detailed description. The distance measurement taken with the distance sensor relates to the distance between the respective reference surface and the distance sensor.

In a further embodiment according to the invention, upon adjusting the position of the optical module within the measuring apparatus, the individual elements of the measuring apparatus remain unchanged in relation to one another.

In a further embodiment according to the invention the optical module is configured for use in a projection exposure system for microlithography. The projection exposure system can in particular be designed as a step-and-scan exposure system which as also known as a "scanner". According to one version the optical module is configured as illumination optics or a projection objective of a projection exposure system for microlithography.

In a further embodiment according to the invention the optical module is configured for use in the EUV and/or higher frequency wavelength range, in particular with wavelengths of less than 100 nm, e.g. 13.5 nm. In this case the optical module is preferably configured catoptrically and has exclusively reflective optical elements. Alternatively, the optical module can also be configured for use in longer-wave wavelength ranges, such as for example in the UV wavelength range, e.g. at 365 nm, 248 nm or 193 nm.

In a further embodiment according to the invention the measuring apparatus has a vacuum chamber and the optical module is disposed in the vacuum changer for measuring the position of the exit beam. This type of measuring apparatus is particularly suitable for measuring an optical module designed for EUV radiation.

In a further embodiment according to the invention the detection element is disposed securely in position when measuring the position of the exit beam in relation to the reference component. As already mentioned above, the detection element is thus disposed in a defined position in relation to the reference component.

In a further embodiment according to the invention the detection element is configured as a mask with measuring markings arranged on the latter. The detection surface is formed by the mask surface having the measuring markings. In a further embodiment according to the invention, the measuring markings which are illuminated by the exit beam are identified using a detector camera. From this the location of the exit beam on the detection surface is determined.

In a further embodiment according to the invention the radiation distribution of the exit beam in the focus plane and/or a pupil plane of the optical module is furthermore measured with a locally resolving sensor. The measuring information can be provided for the mounting of the optical module in the projection exposure system. With possible optical fine adjustment of the projection exposure system for the correction of errors caused independently of the position of the optical module, this measuring information can be taken into consideration.

In a further embodiment of the measuring apparatus according to the invention the adjustment device has furthermore three positioning devices for adjusting the position of the optical module and which are respectively moveable along three coordinate axes orthogonal to one another, a first of the positioning devices having a drive acting along a first of the three coordinate axes, a second of the positioning devices having drives respectively acting along the first and a second of the three coordinate axes, and the third of the positioning devices having drives acting respectively along all three coordinate axes.

In a further embodiment of the method according to the invention for mounting an optical module in a projection exposure system, upon disposing the optical module in the position defined by the position parameters, the actual optical characteristics of the optical module are matched to the optical path of the projection exposure system following the optical module such that during exposure operation of the projection exposure system an exit beam of exposure radiation leaving the optical module enters in a predetermined position into the optical path of the projection exposure system following the optical module. The defined position is to be understood as meaning a predetermined location of the exit beam, i.e. a predetermined position that can be set by moving the exit beam laterally to its propagation direction, and/or a predetermined orientation which can be set by changing the propagation direction of the exit beam.

In a further embodiment according to the invention the optical module is provided with reference elements and the position parameters provided comprise position coordinates of defined coordinate positions for the reference elements in relation to the reference component, the position coordinates being chosen such that upon disposing the reference elements at the respective defined coordinate positions the optical module is disposed in the defined position. Such position coordinates can be provided in all coordinate directions. In a further embodiment according to the invention the reference elements respectively have two reference surfaces tilted towards one another and the position coordinates of the reference elements are provided by distance values of the reference surfaces in relation to respective distance sensors disposed at defined coordinate positions in relation to the reference component.

In a further embodiment according to the invention the optical module comprises a housing, and the reference elements are disposed on the housing.

The features specified with regard to the embodiments of the method according to the invention for arranging an optical module in a measuring apparatus mentioned above can correspondingly be applied to the measuring apparatus according to the invention. Conversely, the features specified with regard to the embodiments of the measuring apparatus according to the invention mentioned above can correspondingly be applied to the method according to the invention. Furthermore, features mentioned with regard to the method for mounting the optical module in a projection exposure system can be applied to the method according to the invention for arranging the optical module in a measuring apparatus or the measuring apparatus according to the invention.

BRIEF DESCRIPTION OF THE DRAWINGS

In the following the invention is described in greater detail with reference to the attached diagrammatic drawings. These show as follows.

DETAILED DESCRIPTION OF EXEMPLARY EMBODIMENTS ACCORDING TO THE INVENTION

In the exemplary embodiments described below, elements which are similar to one another structurally or functionally are provided as far as possible with the same or similar reference numbers. Therefore, in order to understand the features of the individual elements of a specific exemplary embodiment one should refer to the description of other exemplary embodiments or to the general description of the invention.

Figure 1:
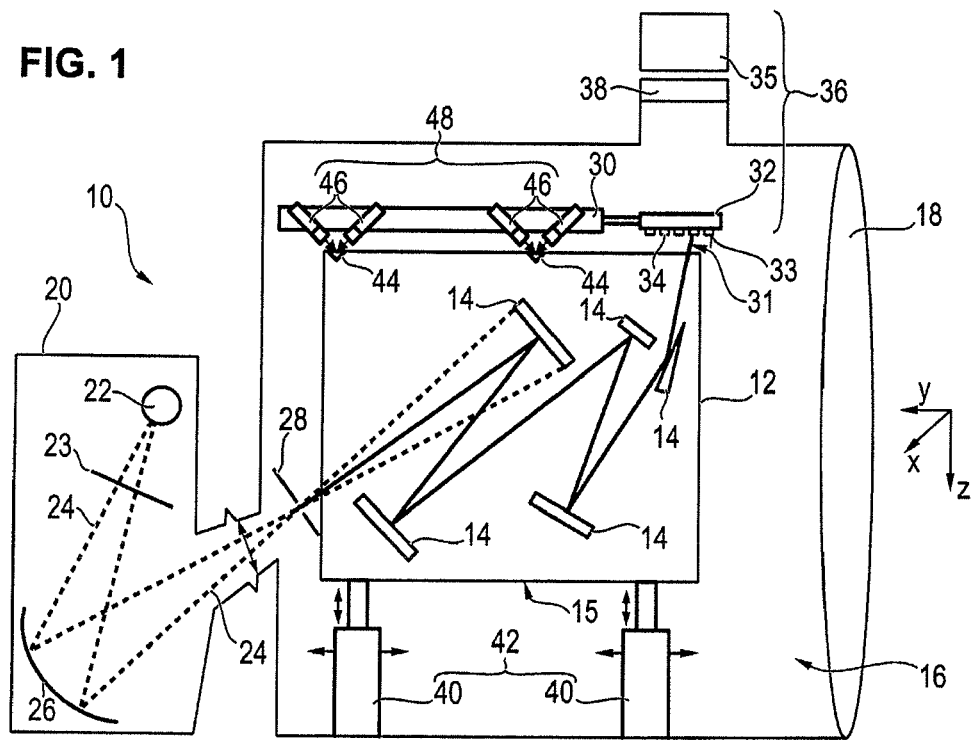
FIG. 1 an embodiment of a measuring apparatus according to the invention for an optical module having a detection module for determining a location of a beam exiting the optical module, a position sensor system and an adjustment device, FIG. 2 the measuring apparatus according to FIG. 1 having a detection module for determining an orientation of the beam exiting the optical module, FIG. 3 the measuring apparatus according to FIG. 1 or 2 having a locally resolving sensor for measuring the beam exiting the optical module, FIG. 4 an illustration of a first embodiment of the position sensor system and the adjustment device of the measuring apparatus according to any of FIGS. 1 to 3, FIG. 5 a detailed illustration of a positioning device comprised by the adjustment device according to FIG. 4, FIG. 6 an illustration of the degrees of freedom of movement and of the drive directions of the positioning devices of the measuring apparatus according to FIG. 4, FIG. 7 a top view of part of the adjustment device according to FIG. 4 in an embodiment according to the invention, FIG. 8 a sectional view of a bearing of a positioning device according to FIG. 5 for supporting the optical module, and FIG. 9 a greatly schematized illustration of a projection exposure system for microlithography having an optical module disposed therein.

FIG. 1 shows an exemplary embodiment of a measuring apparatus 10 according to the invention for an optical module 12. The optical module 12 is configured as illumination optics for a projection exposure system for microlithography. Alternatively, an optical module 12 in the form of projection optics of a projection exposure system or of some other optical system can also be measured in the measuring apparatus 10.

The optical module 12 according to FIG. 1 in the form of illumination optics is designed for operation in the extreme ultraviolet wavelength range (EUV) and therefore includes only reflective optical elements 14. The EUV wavelength range comprises radiation with wavelengths of smaller than 100 nm, in particular with a wavelength of 13.5 nm.

The measuring apparatus 10 comprises an irradiation system 20 for irradiating the optical module 12 with electromagnetic radiation 24 with a wavelength designed for the operating wavelength of the optical module 12. In the present case it is therefore extreme ultraviolet (EUV) radiation. Depending upon the specific configuration of optical module 12 however, other wavelengths can also be used, e.g. wavelengths in the UV wavelength range, e.g. 365 nm, 248 nm or 193 nm.

The irradiation system 20 comprises a radiation source 22, in the case illustrated for producing the electromagnetic radiation 24, a foreign body filter 23 downstream of the radiation source 22, a collector 26 for focusing the radiation 24 onto an aperture 28 directly upstream of the optical module 12. Since in the case illustrated the wavelength of the electromagnetic radiation comes within the EUV wavelength range, the measuring apparatus 10 comprises a vacuum chamber 16 the housing 15 of which encloses the irradiation system 20 and the optical module 12.

The optical module 12 is disposed on three positioning devices 40, only two of which are illustrated in FIG. 1. Here the positioning devices 40 are positioned such that after passing through the aperture 28 the electromagnetic radiation 24 enters into the optical module 12, passes through the optical module 12 and then impinges onto a detection surface 33 as an exit beam 31. Here the optical module 12 is passed through by the electromagnetic radiation 24 in an optical path which corresponds to the optical path through which corresponding exposure radiation passes during operation of a projection exposure system equipped with the optical module 12.

The detection surface 33 is formed by a detection element 32 in the form of a measuring mask or a measuring reticle. The measuring mask comprises a plurality of measuring markings 34 disposed on the detection surface 33. The measuring apparatus 10 further comprises a reference component 30 in the form of a so-called metrology frame. The detection element 32 is disposed in a defined position in relation to the reference component 30, i.e. the position of the detection element 32 in relation to the reference component 30 is known when measuring. Therefore, the detection element 32 can, for example, be connected rigidly to the reference component 30. Alternatively the detection element 32 can also be mounted moveably in relation to the reference component 30, the shift position of the detection element 32 being known when implementing the measurement described in the following. This can be implemented, for example by the detection element 32 for the measurement being disposed in a mechanically pre-specified position, e.g. an engaged position. Alternatively, the position in relation to the reference component 30 can also be determined continuously during the measurement using a distance sensor, such as for example an interferometer.

After disposing the optical module 12 in the measuring apparatus 10 in the way described above, the position of the exit beam 31 in relation to the detection surface 33 is determined. In the embodiment shown in FIG. 1 this happens by determining the location of the exit beam 31 on the detection surface 33. For this purpose, in the present case in which the optical module is designed for EUV radiation, the detection element 32 comprises a quantum converter extending over the detection surface 33 for transforming the EUV radiation into visible light. The measuring apparatus 10 further comprises an inspection glass 38 integrated into the chamber housing 18 above the detection element 32 and a camera 35 disposed above the inspection glass 38. The camera 35 is designed for visible light. Since the exit beam 31 has a limited cross-sectional area, only a limited region of the detection surface 33 is irradiated by the exit beam 31. The camera 35 identifies only the measuring markings 34 which are irradiated by the exit beam 31. The camera 35 therefore "reads" from the measuring markings 34 the location of the exit beam 31 on the detection surface, and so in relation to the reference component 30. The camera 35 and the detection element 32 thus form a detection module 36 for determining the location of the exit beam 31.

The detection module 36 can also be configured in any other way suitable for determining the location of the exit beam in the plane of the detection surface 33. In one embodiment, for example, a locally resolving sensor can be disposed in the plane of the detection surface 33. This type of locally resolving sensor can be a sensor moveable within the plane of the detection surface 33 or be designed in the form of a two-dimensional camera.

Figure 2:
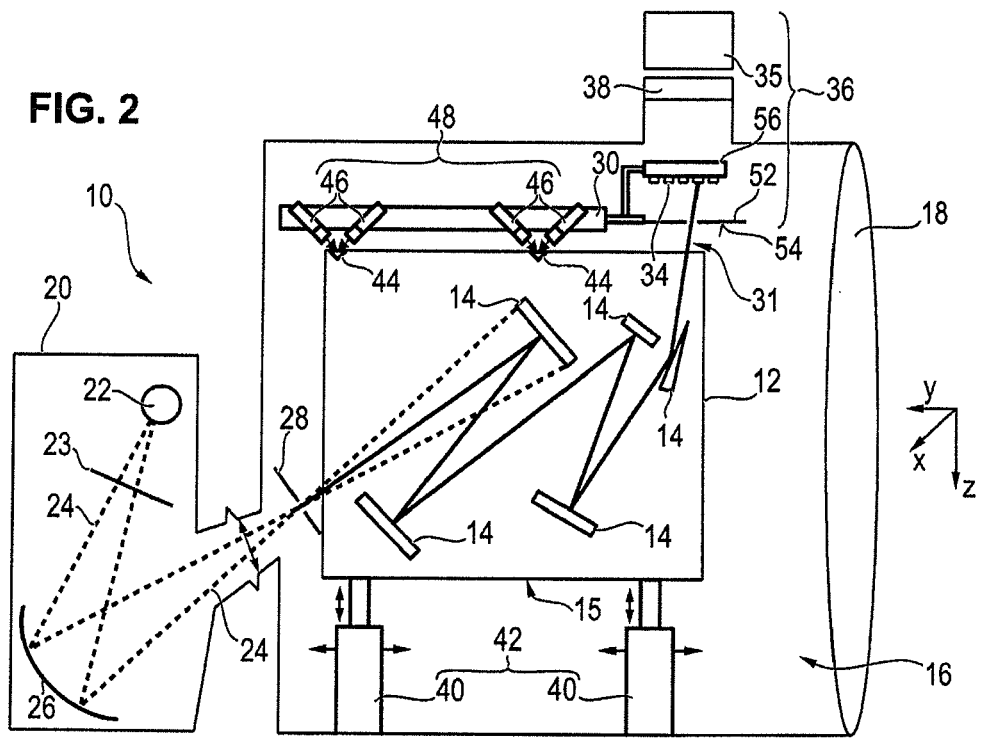

The detection module 36 for measuring the position of the exit beam 31 can additionally or alternatively be configured as shown in FIG. 2. In the embodiment according to FIG. 2 the detection module 36 is designed to determine the orientation of the exit beam 31 in relation to a detection surface 54. The detector surface 54 is the lower side of a second detection element 52 in the form of an aperture. Preferably, the detection surface 54 is disposed in the same plane as the detection surface 33 according to FIG. 1. Above the detection element 52 is disposed a measuring mask 56 which can be designed similarly to the detection element 32 also in the form of a measuring mask.

Both the measuring mask 56 and the detection element 52 are respectively disposed in defined positions in relation to the reference component 30. Therefore the positions of the measuring mask 56 and of the detection element 52 in relation to one another are also defined. In one embodiment according to the invention the detection element 32 according to FIG. 1 can also serve as the measuring mask 56. In this embodiment, after taking the location measurement in the measuring position according to FIG. 1 the detection element 32 is moved upwards in the Z direction according to the coordinate system of FIG. 2, and the detection element 52 in the form of an aperture is disposed in the original position of the detection element 32. The detection element 52 is positioned by movement in the X-Y plane such that the exit beam 31 passes the opening of the aperture.

The location of the exit beam 31 on the measuring mask 56 is determined similarly to determination of the location according to FIG. 1 by identifying the corresponding irradiated measuring markings 34 of the measuring mask 56. From the location of the aperture opening of the detection element 52 and the location of the exit beam 31 on the measuring mask 56 the orientation of the exit beam 31 in relation to the detection surface 54 is then established. As already mentioned above, in one embodiment according to the invention determination of the position of the exit beam in relation to the detection surface 33 and 54 is implemented both by determining the location of the exit beam 31 on the detection surface 33 and the orientation of the exit beam 31 in relation to the detection surface 54 which can extend in the same plane as the detection surface 33. Alternatively just the location of the exit beam 31, or just the orientation of the latter can also be determined.

For the position of the exit beam 31 in relation to the detection surface 33 and 54 a defined position is provided. The defined position is chosen such that when fitting the optical module 12 in a projection exposure system for microlithography provided for this and correspondingly adjusting the position of the optical module 12, the exit beam 31 is matched to the optical path of the projection exposure system following the optical module 12. The adjustment of the optical module 12 in the projection exposure system required for this purpose is described in greater detail in the following.

In order to set up the position of the exit beam 31 the measuring apparatus 10 comprises an adjustment device 42 which comprises three of the positioning devices 40 mentioned above. The positioning devices 40 are arranged such that the optical module 12 can be adjusted in six degrees of freedom, namely in three degrees of translatory freedom and three degrees of rotational freedom. The adjustment device 42 according to FIG. 1 is configured such that the optical module 12 can be moved in the direction of the X axis, the Y axis and the Z axis, and can be tilted about the X axis, about the Y axis and about the Z axis. The optical module 12 is adjusted to the alignment of the exit beam 31 such that the position of the exit beam 31 corresponds to the defined position. Here, for example, only the location of the exit beam 31 can be brought to correspond to a predetermined location on the detection surface 33. In addition or alternatively, the orientation of the exit beam 31 can also be brought to correspond to a predetermined orientation in relation to the detection surface 54. Before adjusting the position of the optical module 12, if so required individual optical elements 14 of the optical module 12 can also be adjusted such that the position of the exit beam is brought into a region close to the predetermined position.

After this adjustment the optical module 12 is located in a defined position. According to the invention position parameters are then established which define this position of the optical module 12 in relation to the reference component 30. For this purpose the measuring apparatus 10 comprises a position sensor system 48 which in the embodiment shown in the figures comprises three pairs of chromatic distance sensors 46. The distance sensors 46 are respectively securely connected to the reference component 30.

Figure 4:
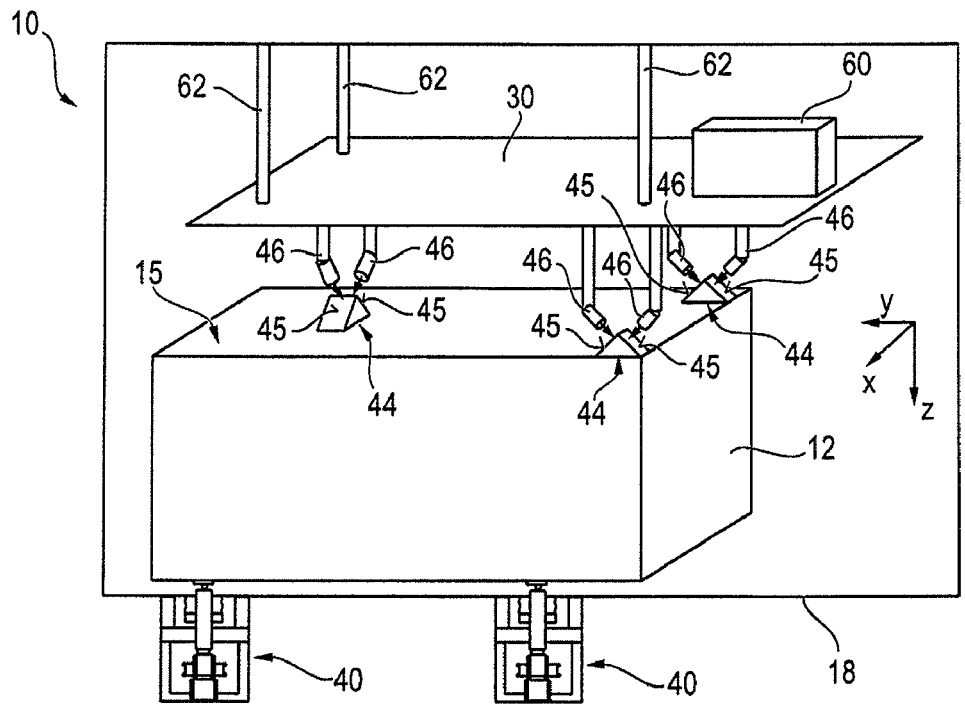

FIG. 4 shows part of the measuring apparatus 10 according to FIGS. 1 and 2 in a partially three-dimensional view with detailed illustration of the distance sensors 46. The optical module 12 has on the upper side of its housing 15 three reference elements 44, respectively in the form of a prism with two reference elements tilted towards one another. Two distance sensors 46 are assigned to each of the reference elements 44. These distance sensors 46 are respectively directed towards one of the reference surfaces 45 of the associated reference element 44.

The reference elements 44 are arranged on the housing 15 of the optical module 12 such that, using a distance measurement of the respective reference surfaces 45 in relation to the assigned distance sensors 46, the position of the optical module 12 in relation to the reference component 30 can be measured in all six degrees of freedom. In the example shown two reference elements 44 are aligned in the same direction and disposed shifted in relation to one another in the X direction. A third reference element 44 is shifted in relation to the first two reference elements 44 in the Y direction and rotated about 90°.

The distance sensors 46 can be, for example, in the form of chromatic distance sensors. With chromatic distance sensors white light is focussed onto a measuring object, here in the form of the reference surface 45. The focus point varies with the wavelength. For the wavelength for which the measuring object is exactly in focus, the most light is reflected back into the measuring head, and for other wavelengths correspondingly less. The spectral distribution of the light reflected back into the measuring head is analysed, and from this the distance between the measuring head and the measuring object is determined. The position parameters of the optical module 12 established with the distance sensors 46 define the position coordinates of the optical module in the X, Y and Z direction and tilt positions of the optical module 12 in relation to the X, Y and Z axis, respectively in relation to the reference component 30.

Furthermore, FIG. 4 shows an embodiment of a suspension of the reference component 30 on the chamber housing 18 using attachment rods 62. Reference number 60 indicates an optical measuring head which is representative of measuring sensors for measuring the exit beam 31, in particular for the detection module 36 according to FIGS. 1 and 2.

Figure 3:
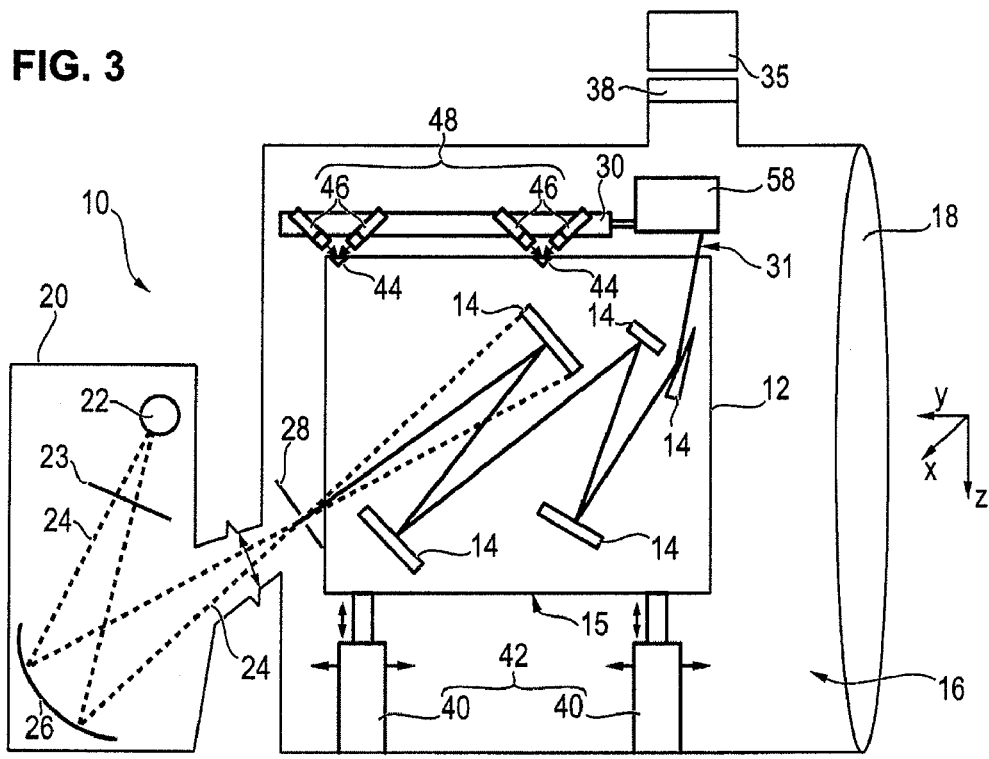

The measuring head 60 can also contain a locally resolving sensor 58, as illustrated in FIG. 3. The locally resolving sensor 58 according to FIG. 3 serves to measure the illumination uniformity of the exit beam in a focus plane or field plane of the optical module 12. Furthermore, radiation distribution within a pupil of the optical module 12 can also be measured using the locally resolving sensor 58. For this purpose the sensor 58 is moved into a plane offset in relation to the focus plane. The locally resolving sensor 58 can be in the form of a two-dimensional intensity sensor, e.g. in the form of a camera, or have a point sensor which can be moved two-dimensionally.

Figure 5:
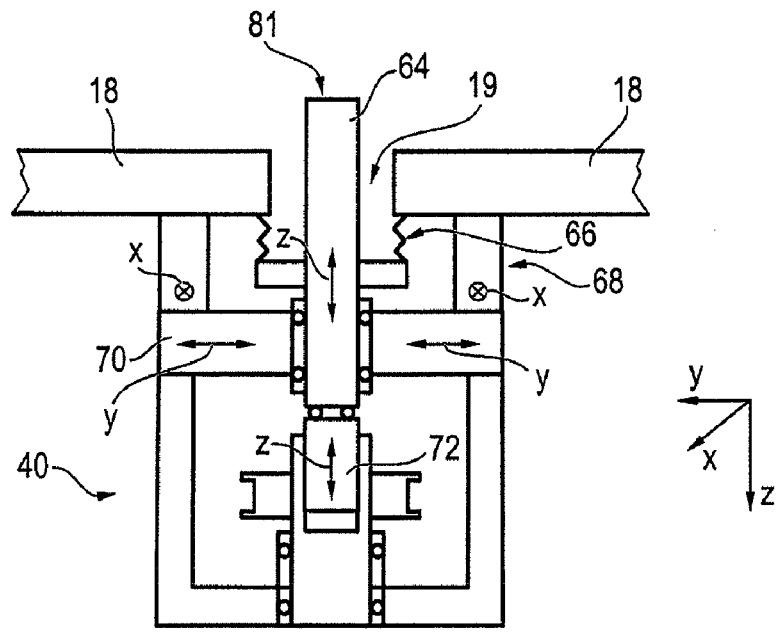

FIG. 5 shows diagrammatically the structure of one of the positioning devices 40 shown in FIG. 4. The positioning device 40 is disposed with its main body outside of the chamber housing 18 of the measuring apparatus 10. The chamber housing 18 has on its underside for each of the positioning devices 40 a recess 19 through which a control element 64 in the form of a plunger of the positioning device 40 enters into the vacuum chamber 16. The plunger 64 is in the form of a bar orientated in the Z direction and is sealed off from the wall of the chamber housing 18 with a bellow-type seal 66 so that the vacuum chamber 16 remains sealed in an air-tight manner.

Figure 8:
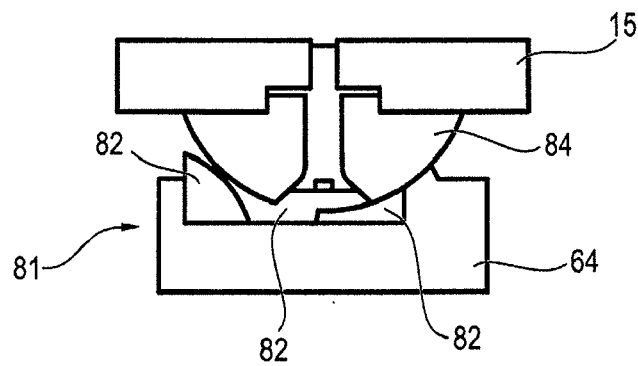

As shown in FIG. 8 the tip of the control element is in the form of a bearing 81 for supporting the optical module 12. The bearing 81 comprises three spherical segments 82 which are arranged in relation to one another such that a hemisphere 84 attached onto the housing 15 of the optical module 12 is mounted tiltably onto the spherical segments.

The positioning device 40 according to FIG. 5 comprises a number of shift modules for moving the control element 64 along the three coordinate axes. A first shift module 68 is configured to move the control element along the X axis. A shift module 70 for moving the control element 64 in the Y direction adjoins the latter. The shift modules 68 and 70 respectively engage onto the casing of the bar via ball bearings. The positioning device 40 further comprises a shift module 72 engaging onto the lower end of the bar-shaped control element 64 via a ball bearing in order to move the control element 64 in the Z direction.

Figure 7:
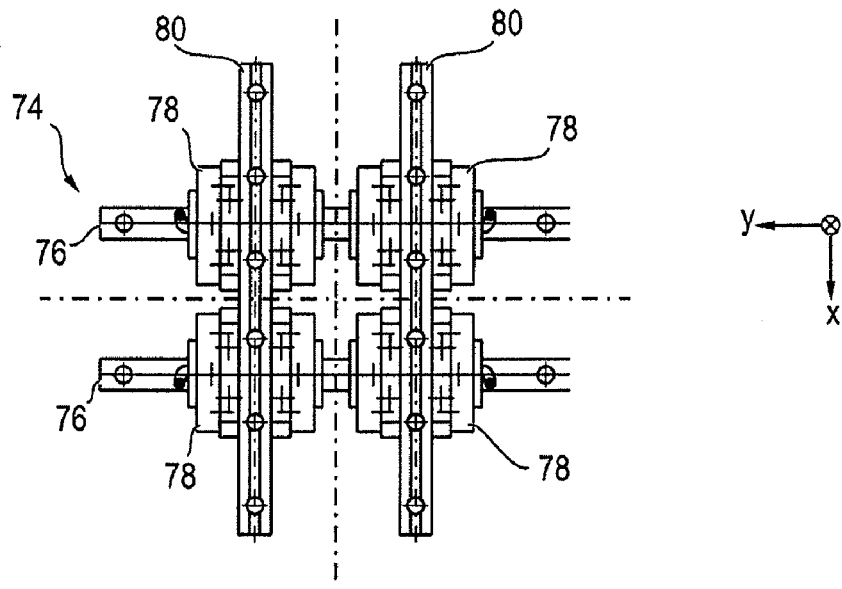

FIG. 7 shows a positioning module 74 in the form of a cross table which has running rails extending in the Y direction on which movement slides 78 are moveably mounted. In turn, different shift rods 80 aligned in the X direction are disposed on the movement slides 78. This type of positioning module 74 can, for example, be integrated into the positioning device 40 in order to implement the functions of the shift modules 68 and 70.

Figure 6:
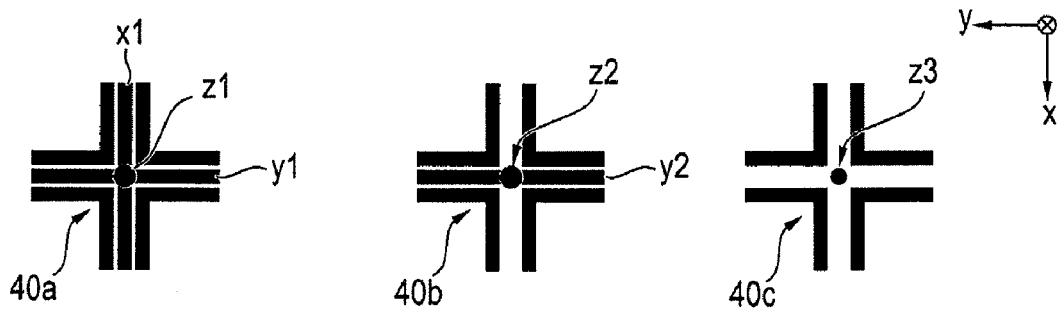

In one embodiment according to the invention the positioning devices 40 according to FIG. 4 are equipped with the functionalities illustrated in FIG. 6. Each of the three positioning devices 40, in the following called positioning devices 40a, 40b and 40c, have guides for movement along the X axis, the Y axis and the Z axis. The positioning device 40a additionally has drives for movement parallel to the Z axis (Z1), parallel to the X axis (X1) and parallel to the Y axis (Y1). The positioning device 40b has drives for movement parallel to the Z axis (Z2) and parallel to the Y axis (Y2). The positioning device 40c has only one drive for movement parallel to the Z axis (Z3).

The positioning devices 40a, 40b and 40c are disposed on the lower side of the housing 15 of the optical module 12 such that by driving the positioning device 40a in the ±X1 direction, the optical module 12 is moved in the ±X direction. In order to move the optical module 12 in the ±Y direction a drive is implemented by driving in the ±Y1 direction with the positioning device 40a and by driving in the ±Y2 direction with the positioning device 40b. The rotation of the optical module 12 about the Z axis can be implemented by the following drive directions: +Y1, −Y2 or −Y1, +Y2. Furthermore, the optical module 12 can also be moved with the positioning devices 40a, 40b and 40c in the direction of the Z axis or be tilted about the X axis or the Y axis.

Figure 9:
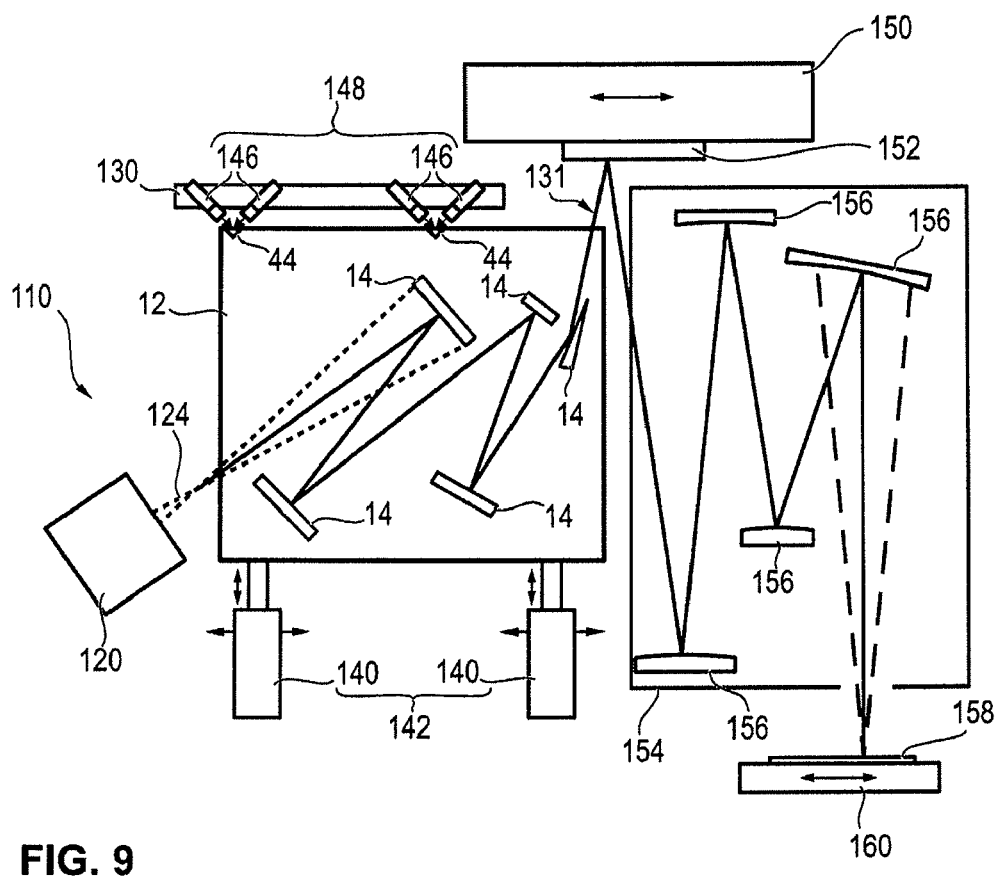

The position parameters established using the position sensor system 48 of the measuring apparatus 10, which, as described above, define the position of the optical module in relation to the reference component 30, can be used according to the invention when mounting the optical module 12 in a projection exposure system 110 according to FIG. 9.

As already mentioned above, the position parameters define a position of the optical module 12 in relation to the reference element 30 of the measuring apparatus 10, the defined position being chosen such that when disposing the optical module 12 in this defined position within the projection exposure system 110, the actual optical characteristics of the optical module are matched to the optical path of the projection exposure system 110 following the optical module 12. In other words, the position is defined such that with corresponding fitting of the optical module into the projection exposure system 110, the exit beam 31 is matched to the optical path following the optical module 12 in the projection exposure system 110.

For this purpose, however, the position of the optical module 12 must be adjusted correspondingly in the projection exposure system 110. For this purpose the projection exposure system 110 comprises a reference component 130 similar to the reference component 30 of the measuring apparatus 10 on which a position sensor system 148 similar to the position sensor system 48 with corresponding distance sensors 146 is disposed. The position parameters generated by the measuring apparatus 10 during the measurement include in the present case respective distance values of the individual distance sensors 146 of the reference surfaces 45 of the reference elements 44 on the optical module 12.

The optical module 12 is positioned with an adjustment device 142 similar to the adjustment device 42 of the measuring apparatus 10 such that the position parameters measured by the position sensor system 148 correspond to the position parameters measured in the measuring apparatus 10. The defined position of the optical module 12 is thus set in relation to the reference component 130. Alternatively, the defined position can also be set using a calibrating gauge.

According to the invention position parameters are determined with the measuring apparatus 10 for the optical module 12 in the projection exposure system 110 which are matched to actual optical characteristics of the optical module 12. In particular, the position parameters are matched to the actual position of the exit beam 31. Variations in the position of the exit beam 31 occurring for technical reasons relating to production are thus taken into account when determining the position parameters. Readjustment of individual optical elements in the optical module 12 or of other elements of the projection exposure system 110 in order to correct these variations is therefore no longer necessary.

The projection exposure system 110 according to FIG. 9 comprises an irradiation system 120 for producing electromagnetic radiation 124, in the present case in the EUV wavelength range. The optical module 12 acts in the present case as illumination optics of the projection exposure system 110. The exit beam 131 passing out of the optical module 12 impinges upon a mask 152 or a reticle which is held by a mask table 150. After the reflection of the radiation on the mask 152 said radiation passes through a projection objective 154 which has a plurality of reflective optical elements 156, and then impinges upon a substrate 158 in the form of a wafer. The substrate 158 is held by a substrate table 160. During exposure operation of the projection exposure system 110 both the mask table 150 and the substrate table 160 are synchronously moved and a region of the mask 152 is thus imaged onto the substrate 158. The projection exposure system 110 according to FIG. 9 is a step-and-scan projection exposure system, the mode of operation of which is basically known to the person skilled in the art.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for mounting an optical module in a projection exposure system for microlithography comprising:
   providing a measuring apparatus, which is external to the projection exposure system, with an irradiation system for irradiating the optical module with electromagnetic radiation, a reference component and a detection element defining a detection surface, the detection element being disposed in a defined position in relation to the reference component,
   disposing the optical module in a position in the measuring apparatus such that the radiation emitted by the irradiation system passes through the optical module and impinges onto the detection surface as an exit beam,
   measuring a position of the exit beam in relation to the detection surface,
   adjusting the position of the optical module within the measuring apparatus, wherein said adjusting comprises bringing the position of the exit beam in relation to the detection surface to correspond to a predetermined position, and
   establishing position parameters defining the position of the optical module in relation to the reference component and
   mounting the optical module into the projection exposure system using the established position parameters.

2. The method according to claim 1,
wherein said measuring of the position of the exit beam in relation to the detection surface comprises determining a location of the exit beam on the detection surface, and
wherein said adjusting of the position of the optical module within the measuring apparatus comprises bringing at least the location of the exit beam on the detection surface to correspond to a predetermined location.

3. The method according to claim 1,
wherein said measuring of the position of the exit beam in relation to the detection surface comprises determining an orientation of the exit beam relative to the detection surface, and wherein said adjusting of the position of the optical module within the measuring apparatus comprises bringing at least the orientation of the exit beam relative to the detection surface to correspond to a predetermined orientation.

4. The method according to claim 1,
wherein the measuring apparatus comprises a second detection element which defines a second detection surface, the second detection element being disposed in a defined coordinate position in relation to the reference component, wherein said measuring of the position of the exit beam in relation to the first detection surface comprises determining a location of the exit beam on the first detection surface and determining an orientation of the exit beam relative to the second detection surface, and wherein said adjusting of the position of the optical module within the measuring apparatus comprises bringing the location of the exit beam on the first detection surface to correspond to a predetermined location and bringing the orientation of the exit beam relative to the second detection surface to correspond to a predetermined orientation.

5. The method according to claim 1,
wherein said establishing of the position parameters of the optical module comprises determining at least one of a location and an orientation of the optical module in relation to the reference component.

6. The method according to claim 1,
wherein the optical module has at least one reference element and said establishing of the position parameters defining the position of the optical module comprises determining a location of the reference element in relation to the reference component in at least one dimension.

7. The method according to claim 6,
wherein the reference element has two reference surfaces tilted towards one another,
wherein the measuring apparatus is further provided with at least one distance sensor disposed in a defined coordinate position in relation to the reference component, and
wherein said establishing of the position parameters comprises measuring a distance between the distance sensor and at least one of the reference surfaces.

8. The method according to claim 1,
wherein, during said adjusting of the position of the optical module within the measuring apparatus, positions of individual elements of the measuring apparatus remain unchanged in relation to one another.

9. The method according to claim 1,
further comprising configuring the optical module for use in a projection exposure system for microlithography.

10. The method according to claim 1,
wherein the optical module is configured as illumination optics or a projection objective of a projection exposure system for microlithography.

11. The method according to claim 1,
wherein the optical module is configured for use in a wavelength range in at least the extreme ultraviolet frequency.

12. The method according to claim 1,
wherein the measuring apparatus has a vacuum chamber and wherein said disposing of the optical module in the measuring apparatus comprises disposing the optical module in the vacuum chamber for said measuring of the position of the exit beam.

13. The method according to claim 1,
further comprising disposing the detection element securely in position for said measuring of the position of the exit beam in relation to the detection surface.

14. The method according to claim 1,
wherein the detection element is configured as a mask with measuring markings arranged on the mask.

15. The method according to claim 14,
further comprising: identifying the measuring markings which are illuminated by the exit beam, and determining the location of the exit beam on the detection surface from the identified measuring markings.

16. The method according to claim 1,
further comprising measuring a radiation distribution of the exit beam in at least one of a focus plane a pupil plane of the optical module with a locally resolving sensor.

17. A measuring apparatus for an optical module comprising:
an irradiation system configured to irradiate the optical module with electromagnetic radiation,
a holding device configured to hold the optical module such that the radiation emitted by the irradiation system passes through the optical module and impinges onto a detection surface as an exit beam,
a reference component,
a detection module with a detection element defining the detection surface, the detection element being disposed in a defined position in relation to the reference component and the detection module being configured to measure a position of the exit beam in relation to the detection surface,
an adjustment device configured to adjust the position of the optical module in the measuring apparatus such that the position of the exit beam in relation to the detection surface is brought to correspond to a predetermined position,
wherein the adjustment device comprises three positioning devices configured to adjust the position of the optical module, wherein the three positioning devices are respectively moveable along at least one of three coordinate axes orthogonal to one another, a first of the positioning devices having a drive acting along a first of the three coordinate axes, a second of the positioning devices having drives respectively acting along the first and a second of the three coordinate axes, and the third of the positioning devices having drives respectively acting along all three coordinate axes, and
a position sensor system which is configured to establish the position parameters which define the position of the optical module in relation to the reference component.

18. The measuring apparatus according to claim 17, configured to carry out a method comprising:
disposing the optical module in a position in the measuring apparatus such that the radiation emitted by the irradiation system passes through the optical module and impinges onto the detection surface as an exit beam,
measuring a position of the exit beam in relation to the detection surface,
adjusting the position of the optical module within the measuring apparatus, including bringing the position of the exit beam in relation to the detection surface to correspond to a predetermined position, and
establishing position parameters defining the position of the optical module in relation to the reference component.

19. A method for mounting an optical module in a projection exposure system for microlithography, the optical module having actual optical characteristics which differ from predetermined optical characteristics, the method comprising:
providing position parameters defining a position for the optical module in relation to a reference component of the projection exposure system, the position parameters selected such that, upon disposing the optical module in the defined position, the actual optical characteristics of the optical module are matched to the optical path of the projection exposure system downstream of the optical module, and
inserting the optical module into the projection exposure system and disposing the optical module in the defined position by adjusting the optical module relative to the reference component,
wherein the position parameters are provided before the optical module is inserted into the projection exposure system.

20. The method according to claim 19,
further comprising, upon said disposing of the optical module in the position defined by the position parameters, matching the actual optical characteristics of the optical module to the optical path of the projection exposure system downstream of the optical module such that during an exposure operation of the projection exposure system, an exit beam of exposure radiation exiting the optical module enters in a further predetermined position into the optical path of the projection exposure system downstream of the optical module.

21. The method according to claim 19, further comprising:
providing the optical module with reference elements, wherein the position parameters provided comprise position coordinates of predetermined coordinate positions for the reference elements in relation to the reference component, and
selecting the position coordinates such that, upon said disposing of the reference elements at respective ones of the coordinate positions, the optical module is disposed in the defined position.

22. The method according to claim 21,
wherein the reference elements respectively have two reference surfaces tilted towards one another, and wherein the position coordinates of the reference elements are provided by distance values of the reference surfaces in relation to respective distance sensors disposed at defined coordinate positions in relation to the reference component.

23. The method according to claim 21,
wherein the optical module comprises a housing and wherein the reference elements are disposed on the housing.

24. A method for mounting an optical module in a projection exposure system for microlithography, the optical module having actual optical characteristics which differ from predetermined optical characteristics, the method comprising:

provide position parameters defining a position for the optical module in relation to a reference component of the projection exposure system, the position parameters selected such that, upon disposing the optical module in the defined position, the actual optical characteristics of the optical module are matched to the optical path of the projection exposure system downstream of the optical module, and inserting the optical module into the projection exposure system and disposing the optical module in the defined position by adjusting the optical module relative to the reference component, wherein said providing of the position parameters for defining the position for the optical module comprises:

providing a measuring apparatus with an irradiation system for irradiating the optical module with electromagnetic radiation, the reference component and a detection element defining a detection surface, the detection element being disposed in a defined position in relation to the reference component, disposing the optical module in a position in the measuring apparatus such that the radiation emitted by the irradiation system passes through the optical module and impinges onto the detection surface as an exit beam, measuring a position of the exit beam in relation to the detection surface, adjusting the position of the optical module within the measuring apparatus, including bringing the position of the exit beam in relation to the detection surface to correspond to a predetermined position, and establishing position parameters defining the position of the optical module in relation to the reference component.

\* \* \* \* \*

UNITED STATES PATENT AND TRADEMARK OFFICE
CERTIFICATE OF CORRECTION

| | |
|---|---|
| PATENT NO. | : 8,400,618 B2 |
| APPLICATION NO. | : 12/706560 |
| DATED | : March 19, 2013 |
| INVENTOR(S) | : Martin Rath, Ulrich Mueller and Waldemar Mielke |

Page 1 of 1

It is certified that error appears in the above-identified patent and that said Letters Patent is hereby corrected as shown below:

In the Specifications:

Column 5, Line 49: delete "as" and insert -- is -- (first occurrence)

In the Claims:

Column 14, Line 59: In Claim 7, delete "at least one" and insert -- each --

Column 15, Line 16: In Claim 13, after "for" delete "said"

Column 15, Line 16: In Claim 13, after "measuring" delete "of"

Column 15, Line 17: In Claim 13, delete "detection surface." and insert -- reference component. --

Column 15, Line 23: In Claim 15, delete "beam," and insert -- beam with a detector camera, --

Column 15, Line 28: In Claim 16, after "focus plane" insert -- and --

Signed and Sealed this
Thirteenth Day of August, 2013

Teresa Stanek Rea
*Acting Director of the United States Patent and Trademark Office*